United States Patent
Shibib

(10) Patent No.: US 6,559,011 B1
(45) Date of Patent: May 6, 2003

(54) DUAL LEVEL GATE PROCESS FOR HOT CARRIER CONTROL IN DOUBLE DIFFUSED MOS TRANSISTORS

(76) Inventor: Muhammed Ayman Shibib, 19 Timberline Dr., Wyomissing, PA (US) 19610

( * ) Notice: Subject to any disclaimer, the term of this patent is extended or adjusted under 35 U.S.C. 154(b) by 153 days.

(21) Appl. No.: 09/692,012

(22) Filed: Oct. 19, 2000

(51) Int. Cl.[7] .............................................. H01L 21/336
(52) U.S. Cl. ........................ 438/268; 257/329; 257/336
(58) Field of Search ................................. 257/329, 336, 257/408; 438/268

(56) References Cited

U.S. PATENT DOCUMENTS

| | | | | |
|---|---|---|---|---|
| 4,317,273 A | * | 3/1982 | Guterman et al. | .......... 257/315 |
| 5,646,055 A | * | 7/1997 | Tsoi | ..................... 148/DIG. 10 |
| 5,681,768 A | * | 10/1997 | Smayling et al. | ........... 438/286 |
| 6,025,237 A | * | 2/2000 | Choi | .......................... 257/335 |
| 6,087,237 A | * | 7/2000 | Hwang | ........................ 438/302 |
| 6,200,868 B1 | * | 3/2001 | Mase et al. | .................. 438/265 |
| 6,271,572 B1 | * | 8/2001 | Fujita | .......................... 257/392 |
| 2002/0000621 A1 | * | 1/2002 | Havemann | .................. 257/384 |

* cited by examiner

Primary Examiner—Michael S. Lebentritt
Assistant Examiner—Christian D. Wilson
(74) Attorney, Agent, or Firm—Peter V. D. Wilde; Thomas, Kayden, Horstemeyer & Risley LLP

(57) ABSTRACT

The specification describes a dual level gate for reducing hot carrier effects in MOS transistors. The dual level gate is formed by undercutting the edges of the gate using a wet etch, and growing oxide in the undercut to a thickness exceeding the gate oxide thickness, thereby lifting the edge of the gate and reducing the electric field concentration at the drain edge of the gate.

7 Claims, 6 Drawing Sheets

DUAL LEVEL GATE PROCESS FOR HOT CARRIER CONTROL IN DOUBLE DIFFUSED MOS TRANSISTORS

FIELD OF THE INVENTION

The field of this invention is design and fabrication of double diffused MOS (DMOS) transistors.

BACKGROUND OF THE INVENTION

DMOS transistors are used widely in both RF analog and mixed-signal integrated circuits (ICs), and in dielectrically isolated ICs for power and high voltage applications. In many of these applications hot carrier injection is a recognized problem. Prior efforts to minimize hot carrier injection include increasing the gate dielectric thickness, increasing the channel length, and reducing the drain doping concentration. However, all of these options carry drawbacks, and are inconsistent with state of the art goals of shrinking technology dimensions. Thicker gate dielectrics reduce the transconductance and power gain and frequency performance. Increasing channel length also results in reducing the transconductance and power gain. Reducing the drain doping level increases drain resistance and reduces output power.

There remains a need for better techniques to reduce hot carrier effects in MOS transistors, as technology dimensions shrink for better device performance.

STATEMENT OF THE INVENTION

I have developed an improved MOS device design and fabrication method that addresses hot carrier problems and other adverse edge effects of MOS transistor gates by using a dual level gate. The dual level gate is realized according to the process aspect of the invention by forming a standard MOS polysilicon gate structure, forming the source and drain regions, then with the source and drain windows open, wet etching (or its equivalent) the gate dielectric using the polysilicon gate as a mask. This results in a substantial undercut of the edges of the polysilicon gate. The gate structure is then thermally oxidized to grow oxide in the undercut regions. The thermal oxidation is allowed to proceed until the oxide thickness at the edge exceeds the oxide thickness in the center region of the gate structure. This results in uniform lifting of the gate at the gate edges. The effective gate dielectric thickness in the regions of the gate that control hot carrier and other edge effects is thereby selectively increased.

DETAILED DESCRIPTION

For the purpose of illustrating the dual level MOS structure of the invention a DMOS transistor is chosen by way of example. The invention is applicable to other MOS devices in which adverse edge effects can be addressed by selectively raising the edge of the gate electrode.

Figure 1:
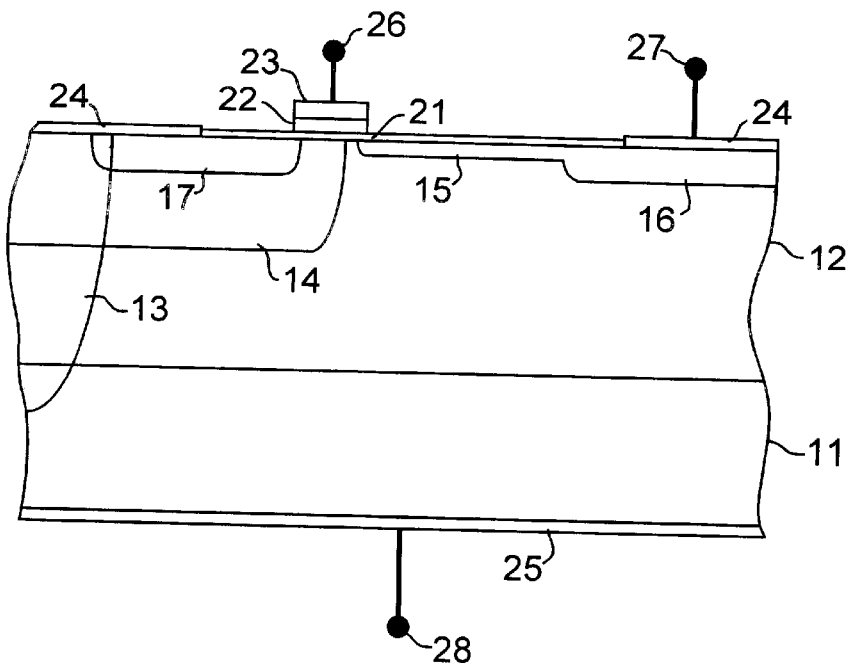
FIG. 1 is a schematic view of an n-channel DMOS device made by a conventional process.

Referring to FIG. 1, for comparison purposes, a DMOS structure with a standard gate is shown, with $p^+$ polysilicon substrate 11 and $p^-$ epitaxial layer 12. The figure shows a portion of a larger substrate with typically thousands of devices in a typical silicon wafer. For illustration, an n-channel RF device is shown. However, the invention applies equally to the complementary p-type DMOS device as well as other kinds of transistors with MOS gates.

Referring again to FIG. 1, a deep diffused source contact region is shown at 13 to provide electrical access to the substrate 11. A p-body impurity region is shown at 14, and $n^+$ drain and source implants are shown at 16 and 17 respectively. An $n^-$ lightly doped drain (LDD) region is shown at 15. The standard gate structure comprises gate oxide layer 21, and polysilicon gate 22. In the embodiment shown here, the polysilicon gate is silicided with silicide layer 23 to increase the conductivity of the gate. This expedient is optional. The source and drain regions on the top of the structure are metallized with metal 24. Metal contact layer 25 is shown schematically on the bottom of the structure and serves as an RF ground. The p-body region 14 and the source and drain regions 16 and 17 can be self-aligned to the polysilicon gate, as will be appreciated from the process description below.

Figure 2:
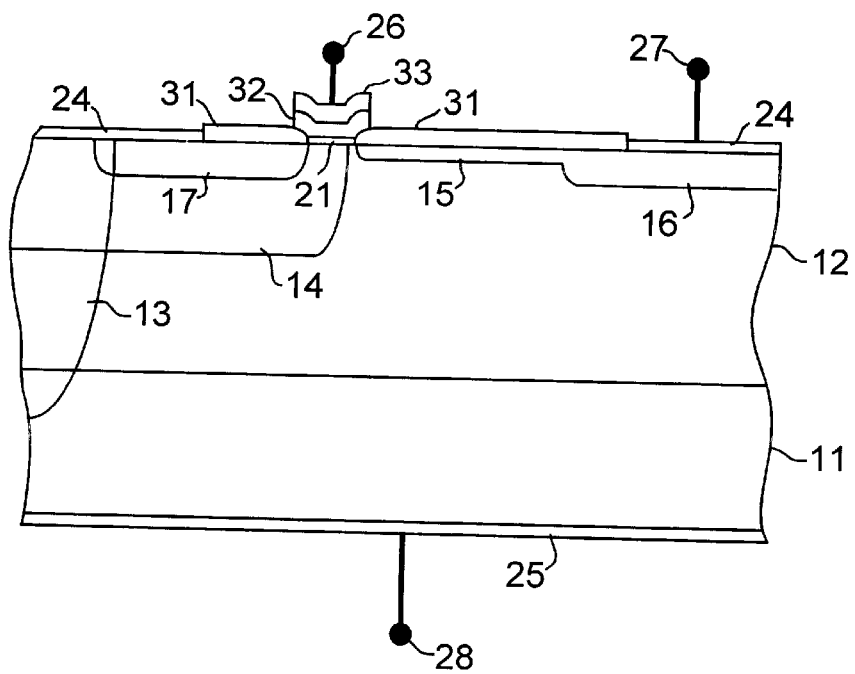
FIG. 2 is a schematic view similar to FIG. 1 showing the improved dual level gate structure of the invention.

The improved DMOS device with a dual level gate is shown in FIG. 2. In this structure the edges of the polysilicon gate 32 (and silicide layer 33) are raised from the substrate, and the source and drain regions, to reduce hot carrier effects. This dual level structure results from a thick oxide layer 31, selectively grown beneath the edges of the gate. As the oxide layer grows, the gate electrode edges are displaced upward to produce the desired edge offset.

The fabrication technique of the invention will be described in conjunction with FIGS. 3–14. The invention is directed to an improved MOS gate structure so these figures show just the gate, source, and drain elements of a single transistor device. It will be understood that these elements may comprise a portion of a much larger integrated circuit chip, and the transistors may or may not be dielectrically isolated. As a preferred embodiment of the device the gate, source, and drain are shown as part of a DMOS device, i.e. having an extended LDD region adjacent the drain.

It will be understood by those skilled in the art that the process steps described here that require selective processing can be achieved by well known photolithographic masking techniques, and standard etching, ion implantation, oxide growth or deposition as required, metal deposition and patterning, etc. These various process steps are sufficiently established in the IC wafer fabrication art that the details are unnecessary to the practice of the invention.

It is also understood that the elements in the figures are not drawn to scale, or in some cases, in the interest of clarity, not even approaching scale.

Also for clarity and brevity, masking layers typically are not illustrated.

Figure 3:
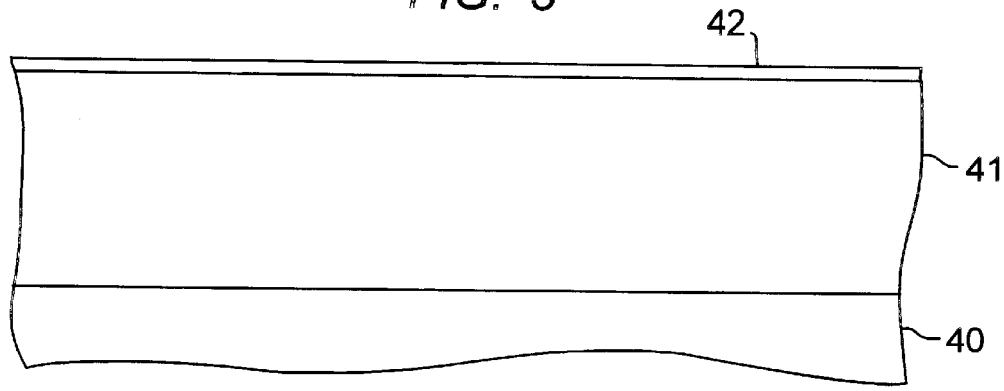
FIGS. 3–14 are schematic representations of a suitable process step sequence for forming the dual level gate structure.
Figure 4:
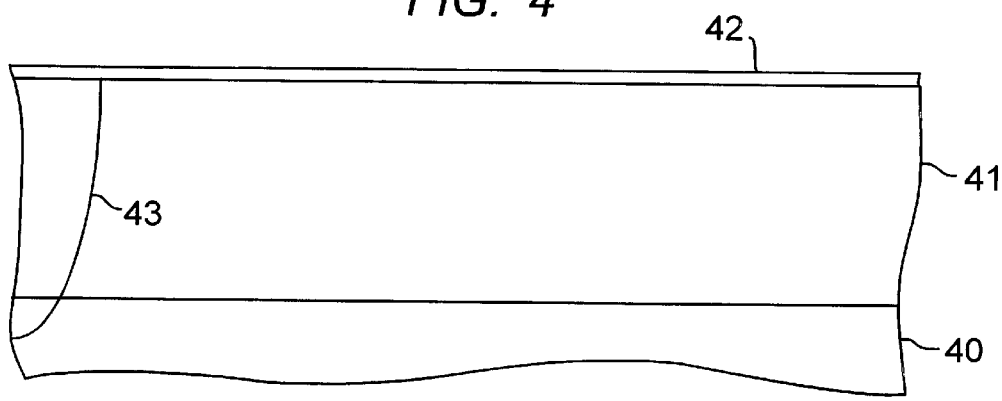

With reference to FIG. 3, a cutaway portion of a larger substrate is shown. The substrate 40 comprises <100> oriented silicon doped $p^+$ with $p^-$ epi layer 41. After standard cleaning, the epi layer 41 is oxidized, preferably thermally, to form the gate dielectric layer 42. The thickness of the thin gate dielectric layer may be 20–1000 Angstroms.

Either prior to or in conjunction with the step represented by FIG. 3, a contact spike to the $p^+$ substrate is formed by suitable masking and implant of boron, and drive to form a contact to the $p^+$ substrate. The $p^+$ substrate constitutes the RF ground in this RF MOS device. This step is represented schematically in FIG. 4, with the p+ deep diffused contact shown at 44, contacting the substrate 40.

Figure 5:
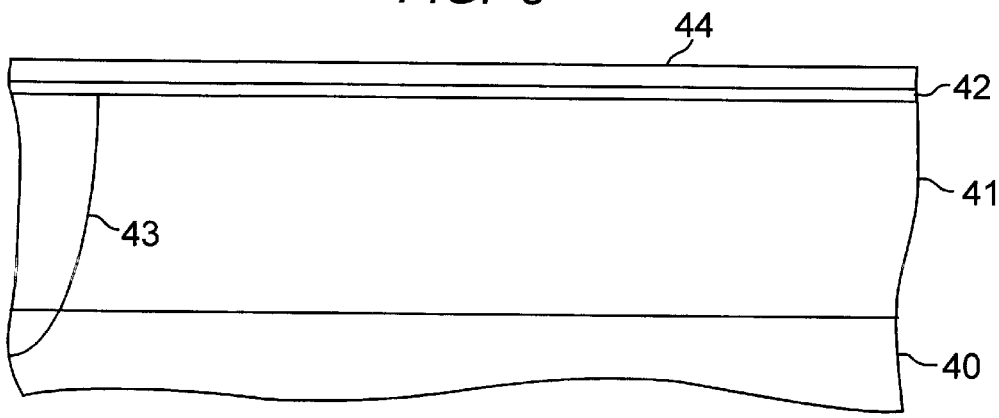
Figure 6:
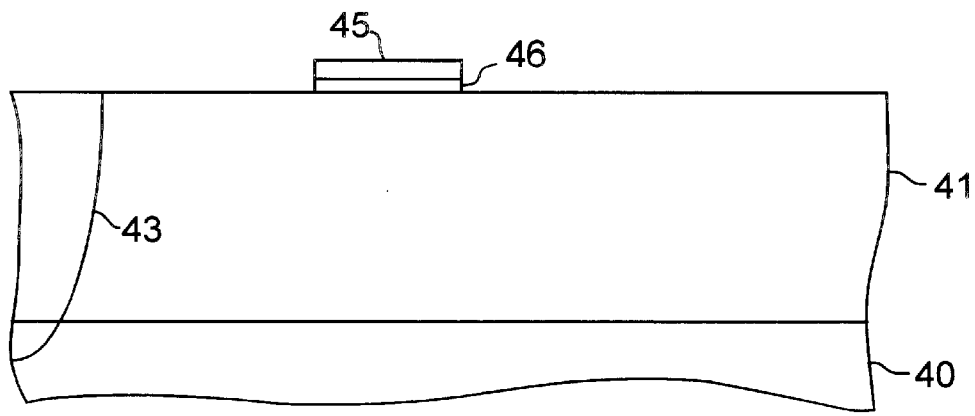

With the gate dielectric layer 42 in place, the polysilicon gate layer 44 is blanket deposited over the structure as shown in FIG. 5. Typically the polysilicon layer is deposited by chemical vapor deposition (CVD) or plasma-enhanced CVD (PE-CVD), and is heavily doped n-type for an n-channel transistor. The gate layer thickness may be in the range 1500–5000 Å. If desired the polysilicon layer may be silicided by deposition of a tantalum, titanium, or platinum group metal surface layer, and heated to form the silicide. This expedient, which is optional, is especially useful for high frequency RF devices as the one described here. Alternatively, salicide techniques can be employed to form the silicide after patterning the gate layer to form the gate. The gate layer 43 is patterned using a lithographic mask (not shown) to define the gate 45 as shown in FIG. 6. The mask by be standard photoresist, but is preferably an oxide hard mask formed by TEOS deposition and standard photoresist patterning. When reference is made herein to photoresist or to lithography it will be understood to include e-beam or x-ray lithography as well as conventional UV lithography. An anti-reflection coating may be applied to the surface of the oxide hardmask to improve edge acuity in defining the gate structures. The use of the oxide hardmask also adds flexibility to the process, since the oxide hard mask can, if desired, be left in place to preserve the gate characteristics during several subsequent processing steps, in particular the oxide growth step to be described in conjunction with FIG. 11. The gate dielectric layer may be etched using the patterned polysilicon gate 45 as a mask as shown at 46. This etch step is typically performed in a plasma etch apparatus in sequence with the polysilicon etch step. The gate dielectric etch step is optional since the implant steps used to form the impurity regions described below can be made effectively through the gate dielectric layer.

The next several steps involve the formation of additional impurity regions within the substrate. A variety of options are available in the sequence used to form these elements. The sequence described here allows the source and LDD regions, as well as the p-body implant, to be self-aligned to the gate.

Figure 7:
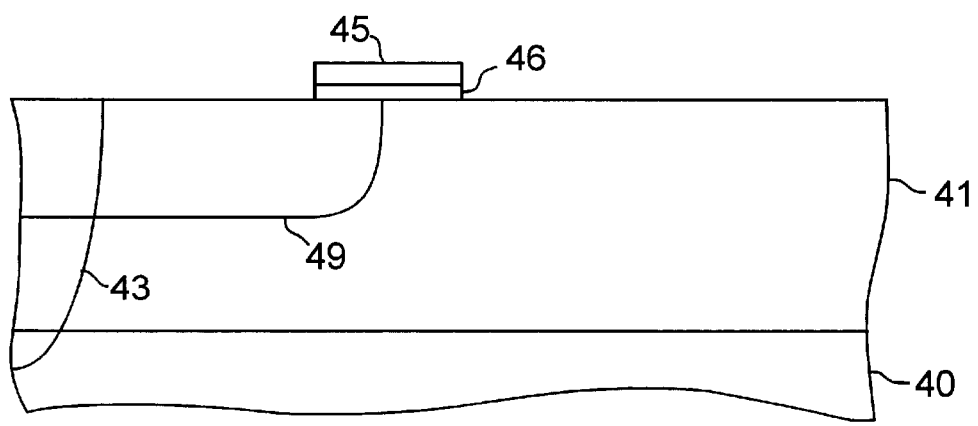

FIG. 7 shows the p-body region 49 selectively implanted into the epi layer 41 using the gate as a mask for self-alignment. The p-body layer 49 may be formed in this example by a boron implant at a dose of 5.5 E12 and energy of 30 kEV, followed by a drive for 60 min. at 1200° C.

Figure 8:
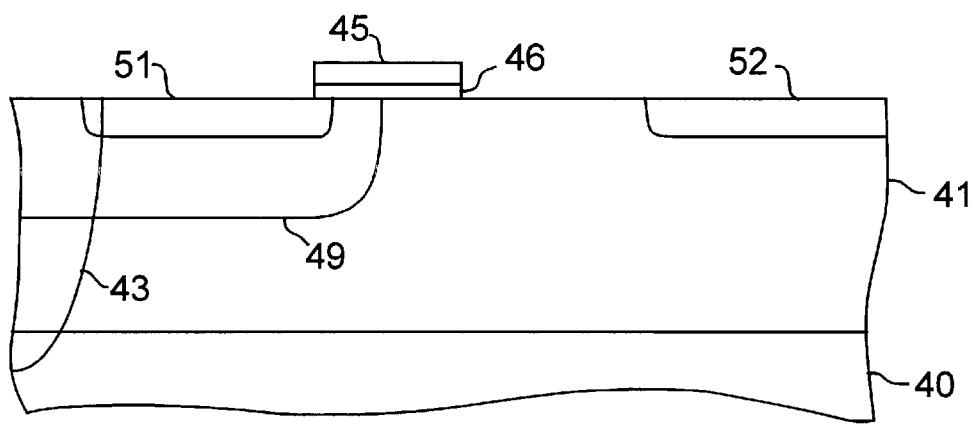

The source 51 and primary drain 52 are then implanted as shown in FIG. 8 using a standard implant. As will be appreciated the source implant 51 is effectively self aligned to the gate. The implanted regions may be formed by conventional phosphorus implant and drive. A standard phosphorus implant, 3.0 E15 at 160 kEV, may be used to form the n-regions shown.

Figure 9:
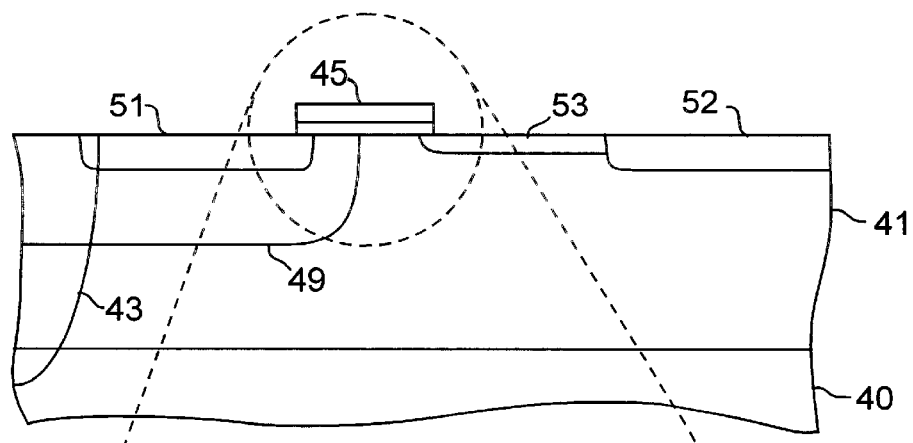

The LDD implant is made at 53 as shown in FIG. 9 and connects the primary drain 52 to the channel. As shown, the LDD 53 is self-aligned to the gate 45. The LDD implant is typically the same as the drain implant but with a smaller dose, e.g. 2E13 cm$^{-2}$. The separation between the primary drain 52 and the channel may be 2–3 microns, yielding a breakdown of, e.g., greater than 50 volts. In the conventional process, the steps just described essentially complete the wafer substrate processing up to metallization. However, in the process of the invention, two additional steps are performed to produce the dual level gate electrode structure.

Figure 10:
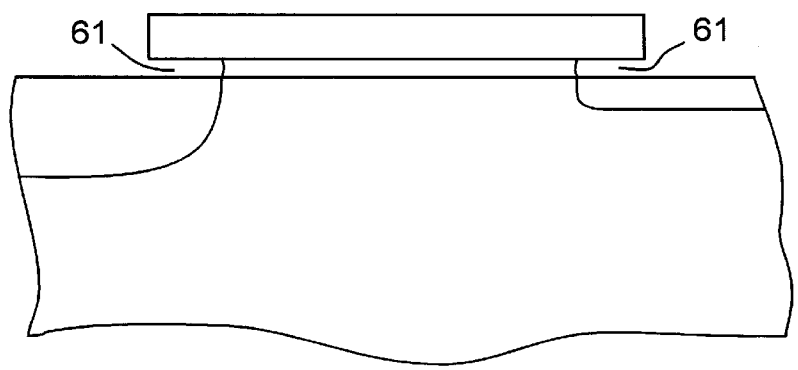

With reference to FIG. 10, the gate dielectric is etched to produce a substantial undercut as shown at 61. The undercut may be produced by wet etching using HF. Other etch techniques that produce a substantial undercut may also be used. These may include isotropic plasma, or vapor etching using HF vapor.

The undercut may alternatively be produced prior to source/drain implant, e.g. in conjunction with the gate dielectric etch described with FIG. 5. Other equivalent step sequences may be devised. The objective, for the purpose of the invention, is to have a substantial undercut of the polysilicon gate as shown in FIG. 10. The undercut may be at least 0.05 microns, and preferably at least 0.1 microns. The desired undercut may also be specified as a percentage of the gate width. For a typical gate width of 0.3 to 0.8 microns, an undercut of at least 10%, and preferably at least 20%, (including both edges) is suitable.

Figure 11:
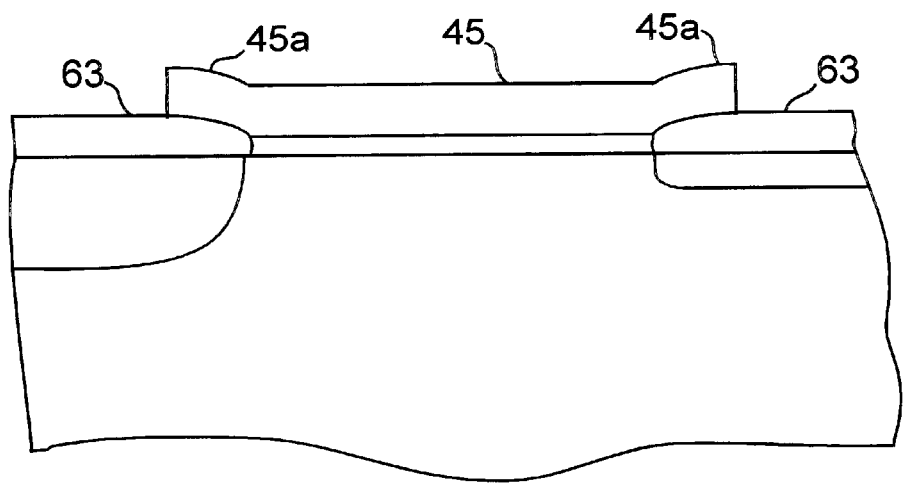

After producing the undercut, the gate region is thermally oxidized to grow silicon dioxide in the undercut region. This is shown in FIG. 11, where the grown oxide appears at 63. The effect of growing oxide in the undercut is to lift the edges 45a of the gate 45 as illustrated. As described earlier, this reduces the electric field at the gate edge and reduces hot carrier injection into the drain.

In terms of the thickness t of the gate dielectric, it is recommended that the oxide grown in the undercut region have a thickness of at least 1.5t, and preferably at least 2t. This oxide is grown by standard techniques at high temperature and pressure, typically using the same conditions used to form the gate dielectric layer but increasing the growth time by at least 50%. The oxide under the gate may also grow during this step but will grow to a substantially smaller thickness. However, the additional oxide growth will be factored into the overall process to achieve the final gate dielectric thickness desired.

Figure 12:
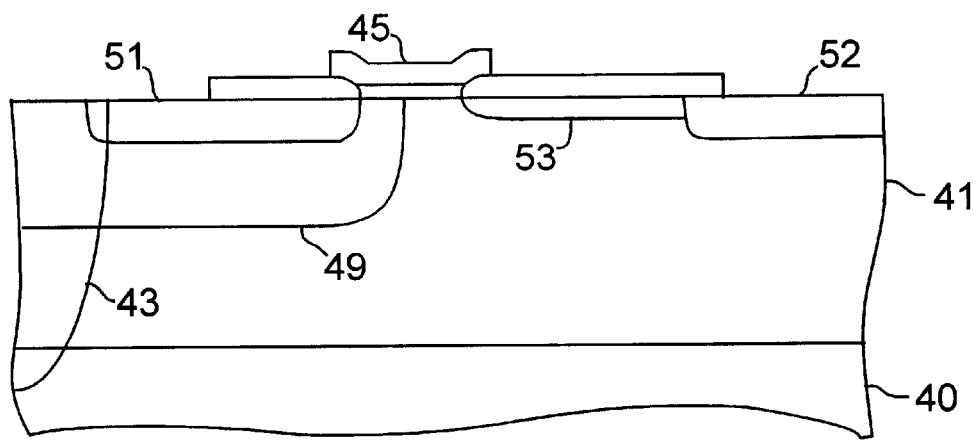
Figure 13:
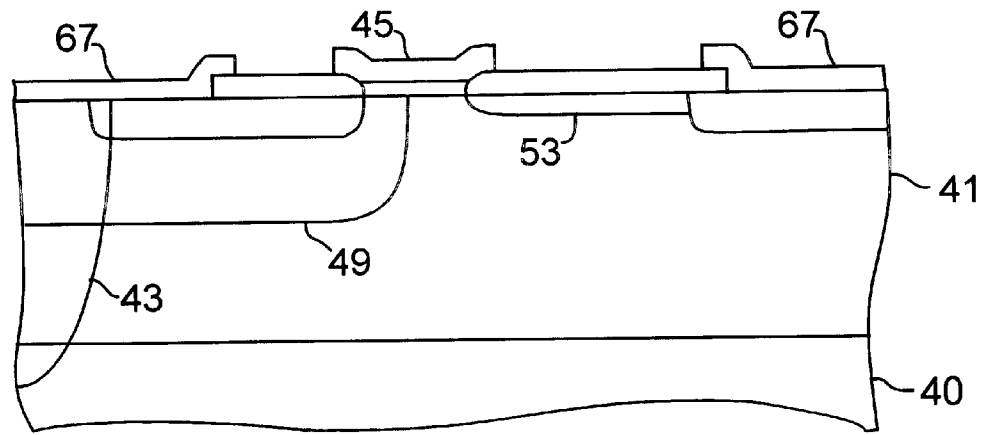
Figure 14:
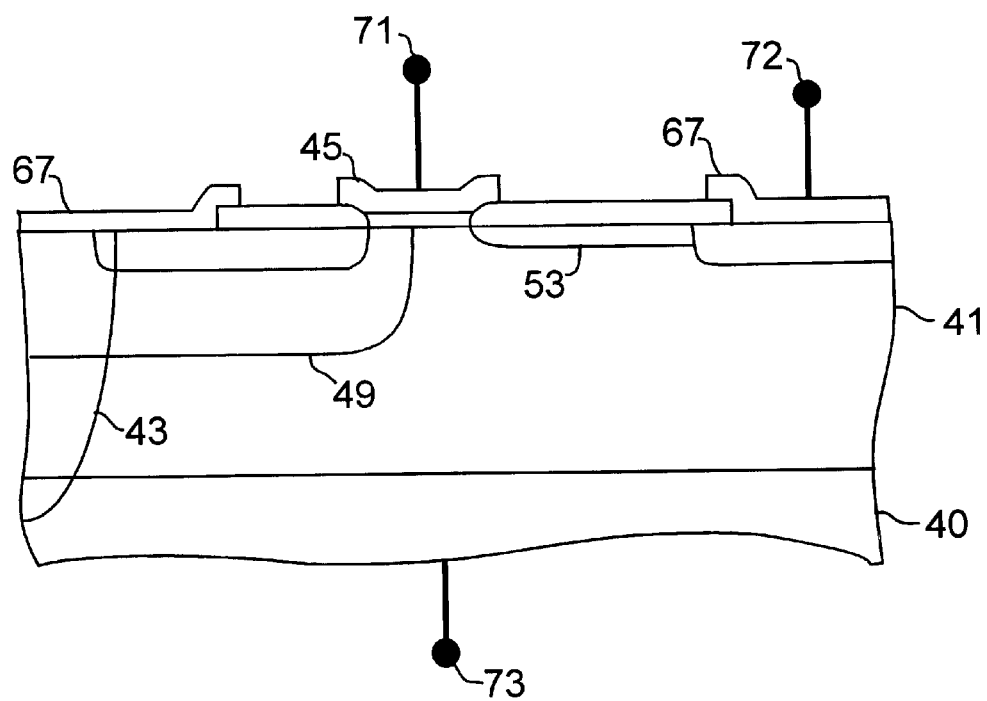

The device is completed by forming the source, drain, and gate contacts. FIG. 12 shows the source 51 and drain 52 exposed in preparation for selective deposition of contact metallization. The contact metal 67 is shown patterned over the source and drain in FIG. 13. Typically this step involves forming an oxide layer on the source/drain windows, and patterning the oxide to form contact windows. Aluminum or gold metallization is formed over the patterned structure and itself patterned to form the metallization for the IC. A standard SINCAP or polyimide layer (not shown) is deposited to passivate the final IC structure. The interconnection metallization is shown schematically in FIG. 14, with gate 71, drain 72, and source (RF ground) 73.

Reference made herein to silicon gate, polysilicon gate, etc. are intended to refer to silicon gates of polycrystalline silicon or amorphous silicon.

As a consequence of the step sequence described above, both the source side of the gate and the drain side of the gate are lifted from the substrate. However, the step sequence may be altered if desired so that only the drain side of the gate is lifted, since the hot carrier injection problem impacts this side of the transistor structure.

In FIG. 10, the undercut on both the source side and the drain side of the gate appears the same. This result follows from the step sequence given. However, the source implant in the device shown is typically deeper than the LDD drain implant, and extends further beneath the gate. If desired, an additional mask step can be introduced so that the undercut is asymmetrical, i.e. further on one side than the other. This allows the gate edge to be lifted mainly on the portion that overlies the source/drain. Lifting the gate in the channel region may adversely affect the threshold voltage.

It is known that other MOS devices, e.g. digital logic devices, and even memory devices, experience hot carrier problems. It will be evident to those skilled in the art that the principle and process of the invention may be applied to advantage to a variety of MOS devices. These devices may or may not have an LDD as described above, so for purposes of defining the invention, reference to a drain or drain region adjacent the gate includes both devices with and without an LDD.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. A method for fabricating an MOS transistor comprising the steps of:
   a. growing a gate dielectric layer with a thickness t on a gate region of a semiconductor substrate,
   b. depositing a polysilicon gate layer on the gate dielectric layer,
   c. selectively etching the polysilicon gate layer to form a polysilicon gate on a portion of the gate dielectric layer the polysilicon gate having a first edge,
   d. forming a drain region in the semiconductor substrate by implanting impurities into the semiconductor substrate to form an implanted drain region, the implanted drain region having a first edge, the implanting step using the polysilicon gate as a mask so that the first edge of the polysilicon gate and the first edge of the implanted drain region are in vertical alignment, and thereafter,
   e. etching the gate dielectric layer to produce an undercut region beneath the polysilicon gate, and
   f. growing an oxide layer on the undercut region to a thickness of at least 1.5 t, thereby lifting the first edge of the polysilicon gate.

2. The method of claim 1 including forming a source region adjacent to the polysilicon gate.

3. The method of claim 2 wherein the polysilicon gate layer is selectively etched using an oxide mask.

4. The method of claim 1 wherein the oxide layer on the undercut region is grown to a thickness of at least 2 t.

5. The method of claim 1 wherein the undercut region extends to at least 10% of the width of the polysilicon gate.

6. The method of claim 1 wherein the semiconductor substrate is silicon.

7. A method for fabricating an DMOS transistor comprising the steps of:
   a. growing an epitaxial layer on a silicon substrate,
   b. growing an MOS gate dielectric layer on the epitaxial layer, the MOS gate dielectric layer having a thickness t,
   c. depositing a polysilicon gate layer on the MOS gate dielectric layer,
   d. selectively etching the polysilicon gate layer to form a polysilicon gate on a portion of the gate dielectric layer the polysilicon gate having a first edge,
   e. forming an n-type impurity region extending through the epitaxial layer to the silicon substrate,
   f. implanting n-type impurities into the silicon substrate to form a source adjacent to the polysilicon gate and a drain spaced from the polysilicon gate,
   g. forming a lightly doped drain (LDD) between the polysilicon gate and the drain by implanting n-type impurities into the silicon substrate to form an implanted drain region, the implanted drain region having a first edge, the implanting step using the polysilicon gate as a mask so that the first edge of the polysilicon gate and the first edge of the LDD are in vertical alignment, and thereafter:
   h. etching the gate dielectric layer to produce an undercut region beneath the first edge of the polysilicon gate,
   i. growing an oxide layer on the undercut region to a thickness of at least 1.5 t thereby lifting the first edge of the polysilicon gate.

* * * * *